United States Patent
Chen et al.

(10) Patent No.: US 9,876,120 B2
(45) Date of Patent: Jan. 23, 2018

(54) LOW TEMPERATURE POLY-SILICON TFT SUBSTRATE AND MANUFACTURING METHOD THEREOF

(71) Applicant: Wuhan China Star Optoelectronics Technology Co., Ltd., Wuhan (CN)

(72) Inventors: Gui Chen, Wuhan (CN); Qiang Gong, Wuhan (CN)

(73) Assignee: WUHAN CHINA STAR OPTOELECTRONICS TECHNOLOGY CO., LTD., Wuhan, Hubei (CN)

( * ) Notice: Subject to any disclaimer, the term of this patent is extended or adjusted under 35 U.S.C. 154(b) by 86 days.

(21) Appl. No.: 14/912,610

(22) PCT Filed: Jan. 29, 2016

(86) PCT No.: PCT/CN2016/072772
§ 371 (c)(1),
(2) Date: Feb. 18, 2016

(87) PCT Pub. No.: WO2017/101203
PCT Pub. Date: Jun. 22, 2017

(65) Prior Publication Data
US 2017/0256651 A1    Sep. 7, 2017

(30) Foreign Application Priority Data
Dec. 14, 2015   (CN) .......................... 2015 1 0936669

(51) Int. Cl.
*H01L 29/78*   (2006.01)
*H01L 29/786*   (2006.01)
(Continued)

(52) U.S. Cl.
CPC ...... *H01L 29/78696* (2013.01); *H01L 27/127* (2013.01); *H01L 27/1222* (2013.01);
(Continued)

(58) Field of Classification Search
CPC ......... H01L 29/78696; H01L 29/78621; H01L 29/78678
See application file for complete search history.

(56) References Cited

U.S. PATENT DOCUMENTS

2001/0030323 A1\* 10/2001 Ikeda ................ H01L 29/78645
257/59

\* cited by examiner

*Primary Examiner* — Trang Tran
(74) *Attorney, Agent, or Firm* — Leong C. Lei

(57) ABSTRACT

The present invention provides a LTPS TFT substrate and a manufacturing method thereof. The LTPS TFT substrate of the present invention includes a metal layer formed on a channel zone so that the metal layer, a source electrode, and a drain electrode can be used as a mask to form LDD zones in a poly-silicon layer in order to save the mask needed for separately forming the LDD zones; further, due to the addition of the metal layer that is connected to the channel zone of the poly-silicon layer, the electrical resistance of the channel zone can be effectively reduced to increase a TFT on-state current. The LTPS TFT substrate manufacturing method of the present invention forms a metal layer on a channel zone at the same time of forming a source electrode and a drain electrode and uses the metal layer, the source electrode, and the drain electrode as a mask to form LDD zones in a poly-silicon layer so as to save the mask needed for separately forming the LDD zones thereby reducing the manufacturing cost and increasing throughput.

5 Claims, 2 Drawing Sheets

(51) Int. Cl.
*H01L 27/12* (2006.01)
*H01L 29/49* (2006.01)
(52) U.S. Cl.
CPC .... *H01L 29/4908* (2013.01); *H01L 29/78621* (2013.01); *H01L 29/78678* (2013.01)

LOW TEMPERATURE POLY-SILICON TFT SUBSTRATE AND MANUFACTURING METHOD THEREOF

BACKGROUND OF THE INVENTION

1. Field of the Invention

The present invention relates to the field of display technology, and in particular to a low temperature poly-silicon (LTPS) thin-film transistor (TFT) substrate and a manufacturing method thereof.

2. The Related Arts

Liquid crystal displays (LCDs) have a variety of advantages, such as thin device body, low power consumption, and being free of radiation, and are thus of wide applications, such as mobile phones, personal digital assistants (PDAs), digital cameras, computer monitors, and notebook computer screens.

Most of the liquid crystal displays that are currently available in the market are backlighting liquid crystal displays, which comprise an enclosure, a liquid crystal panel arranged in the enclosure, and a backlight module mounted in the enclosure. The structure of a conventional liquid crystal panel is made up of a color filter (CF) substrate, a thin-film transistor (TFT) array substrate, and a liquid crystal layer arranged between the two substrates and the principle of operation is that a driving voltage is applied to the two glass substrates to control rotation of the liquid crystal molecules of the liquid crystal layer in order to refract out light emitting from the backlight module to generate an image.

The LTPS technology is a manufacturing technique for a new generation TFT substrate. Compared to the traditional amorphous silicon (a-Si) technology, the LTPS displays have a faster response speed and show various advantages including high brightness, high resolution, and low power consumption. For the LTPS technology, the one that is most commonly used by most of the major manufacturers is the top gate LTPS TFT substrate. However, the top gate LTPS TFT substrate is often additionally provided with a light-shielding metal layer on a bottom of a TFT device located in an active area in order to prevent the influence caused by a leakage current resulting from light irradiation. This increases the manufacturing cost of the LTPS TFT substrates. This implies the development of bottom gate LTPS TFT substrates would be of significant meaning in the respect of saving cost and increasing throughput.

Referring to FIG. 1, a cross-sectional view is given to illustrate the structure of a conventional bottom gate LTPS TFT substrate, which comprises a base plate 100, a gate electrode 200 formed on the base plate 100, a gate insulation layer 300 formed on the substrate 100 and the gate electrode 200, a poly-silicon layer 400 formed on the gate insulation layer 300, and a source electrode 500 and a drain electrode 600 formed on the gate insulation layer 300 and the poly-silicon layer 400. The poly-silicon layer 400 comprises source/drain contact zones 410 located at two sides thereof and respectively in engagement with the source electrode 500 and the drain electrode 600, a channel zone 420 located at a center of the poly-silicon layer 400, and lightly doped drain (LDD) zones 430 respectively located between the source/drain contact zones 410 and the channel zone 420. In such a process of manufacturing the LTPS TFT substrate, the source/drain contact zone 410, the channel zone 420, and the LDD zones 430 need to be doped separately and such a manufacturing process needs at least two masks, making the operation complicated, the manufacturing efficiency low, and the manufacturing cost high.

Thus, it is desired to provide a LTPS TFT substrate and a manufacturing method thereof that help overcome the above-discussed problems.

SUMMARY OF THE INVENTION

An object of the present invention is to provide a low temperature poly-silicon (LTPS) thin-film transistor (TFT) substrate that comprises a metal layer arranged on a channel zone so that the electrical resistance of the channel zone is reduced and the TFT on-state current is relatively high.

Another object of the present invention is to provide a LTPS TFT substrate manufacturing method that forms a metal layer on a channel zone and forms lightly-doped drain (LDD) zones in a poly-silicon layer with the metal layer and a source electrode and a drain electrode as a mask so as to save the mask required for separately forming the LDD zones thereby reducing the manufacturing cost and increasing the throughput.

To achieve the above objects, the present invention provides a LTPS TFT substrate, which comprises a base plate, a gate electrode formed on the base plate, a gate insulation layer formed on the base plate and the gate electrode, a poly-silicon layer formed on the gate insulation layer, a source electrode and a drain electrode formed on the gate insulation layer and the poly-silicon layer, and a metal layer formed on the poly-silicon layer and located between the source electrode and the drain electrode;

the poly-silicon layer comprising source/drain contact zones located on two opposite sides thereof and respectively in engagement with the source electrode and the drain electrode, a channel zone located under the metal layer, and LDD zones respectively located between the source/drain contact zones and the channel zone.

The base plate comprises a glass plate.

The gate insulation layer is formed of a material comprising silicon nitride, silicon oxide, or a combination thereof.

The gate electrode, the source electrode, the drain electrode, and the metal layer are each formed of a material comprising one of molybdenum, aluminum, and copper or a stacked combination of multiple ones thereof.

The source/drain contact zones are N-type heavily-doped zones; the channel zone is a P-type heavily-doped zone; and the LDD zones are N-type lightly-doped zones; or alternatively, the source/drain contact zones are P-type heavily-doped zones; the channel zone is an N-type heavily-doped zone; and the LDD zones are N-type lightly-doped zones.

The present invention also provide a LTPS TFT substrate manufacturing method, which comprises the following steps:

(1) providing a base plate, depositing a first metal layer on the base plate, and subjecting the first metal layer to a patterning operation to form a gate electrode;

(2) depositing a gate insulation layer on the base plate and the gate electrode;

(3) forming a poly-silicon layer on the gate insulation layer;

(4) subjecting two opposite sides of the poly-silicon layer to ion implantation to form source/drain contact zones; and subjecting a central area of the poly-silicon layer to ion implantation to form a channel zone;

(5) depositing a second metal layer on the gate insulation layer and the poly-silicon layer and subjecting the second metal layer to a patterning operation to form a source electrode, a drain electrode, and a metal layer located between the source electrode and the drain electrode; and (6) using the metal layer and the source and drain electrodes as a mask to subject the poly-silicon layer to ion implantation so as to form LDD zones located respectively between the source/drain contact zones and the channel zone.

In step (1), the base plate comprises a glass plate.

In Claim 6, wherein in step (2), the gate insulation layer is formed of a material comprising silicon nitride, silicon oxide, or a combination thereof.

The gate electrode, the source electrode, the drain electrode, and the metal layer are each formed of a material comprising one of molybdenum, aluminum, and copper or a stacked combination of multiple ones thereof.

The source/drain contact zones are N-type heavily-doped zones; the channel zone is a P-type heavily-doped zone; and the LDD zones are N-type lightly-doped zones; or alternatively the source/drain contact zones are P-type heavily-doped zones; the channel zone is an N-type heavily-doped zone; and the LDD zones are N-type lightly-doped zones.

The present invention further provides a LTPS TFT substrate, which comprises a base plate, a gate electrode formed on the base plate, a gate insulation layer formed on the base plate and the gate electrode, a poly-silicon layer formed on the gate insulation layer, a source electrode and a drain electrode formed on the gate insulation layer and the poly-silicon layer, and a metal layer formed on the poly-silicon layer and located between the source electrode and the drain electrode;

the poly-silicon layer comprising source/drain contact zones located on two opposite sides thereof and respectively in engagement with the source electrode and the drain electrode, a channel zone located under the metal layer, and LDD zones respectively located between the source/drain contact zones and the channel zone;

wherein the base plate comprises a glass plate;

wherein the gate insulation layer is formed of a material comprising silicon nitride, silicon oxide, or a combination thereof;

wherein the gate electrode, the source electrode, the drain electrode, and the metal layer are each formed of a material comprising one of molybdenum, aluminum, and copper or a stacked combination of multiple ones thereof; and wherein the source/drain contact zones are N-type heavily-doped zones; the channel zone is a P-type heavily-doped zone; and the LDD zones are N-type lightly-doped zones; or alternatively, the source/drain contact zones are P-type heavily-doped zones; the channel zone is an N-type heavily-doped zone; and the LDD zones are N-type lightly-doped zones.

The efficacy of the present invention is that the present invention provides a LTPS TFT substrate, which comprises a metal layer formed on a channel zone so that the metal layer, a source electrode, and a drain electrode can be used as a mask to form LDD zones in a poly-silicon layer in order to save the mask needed for separately forming the LDD zones; further, due to the addition of the metal layer that is connected to the channel zone of the poly-silicon layer, the electrical resistance of the channel zone can be effectively reduced to increase a TFT on-state current. The present invention also provides a LTPS TFT substrate manufacturing method, in which at the same time of forming a source electrode and a drain electrode, a metal layer is formed on a channel zone and the metal layer, the source electrode, and the drain electrode are used as a mask to form LDD zones in a poly-silicon layer so as to save the mask needed for separately forming the LDD zones thereby reducing the manufacturing cost and increasing throughput.

BRIEF DESCRIPTION OF THE DRAWINGS

The technical solution, as well as other beneficial advantages, of the present invention will be apparent from the following detailed description of embodiments of the present invention, with reference to the attached drawing. In the drawing.

DETAILED DESCRIPTION OF THE PREFERRED EMBODIMENTS

To further expound the technical solution adopted in the present invention and the advantages thereof, a detailed description is given to a preferred embodiment of the present invention and the attached drawings.

Figure 1:
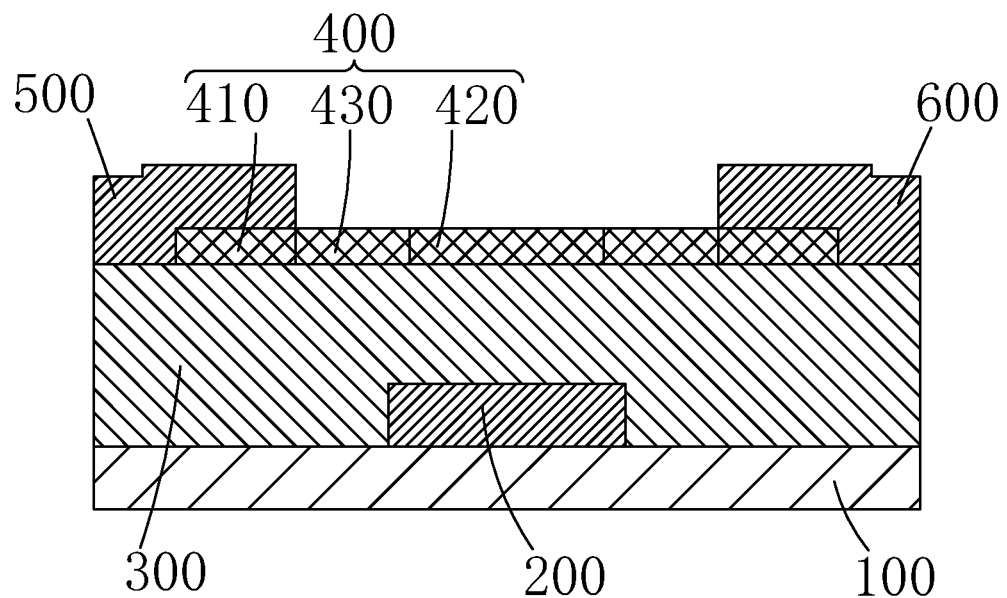
FIG. 1 is a cross-sectional view showing the structure of a conventional low temperature poly-silicon (LTPS) thin-film transistor (TFT) substrate.
Figure 2:
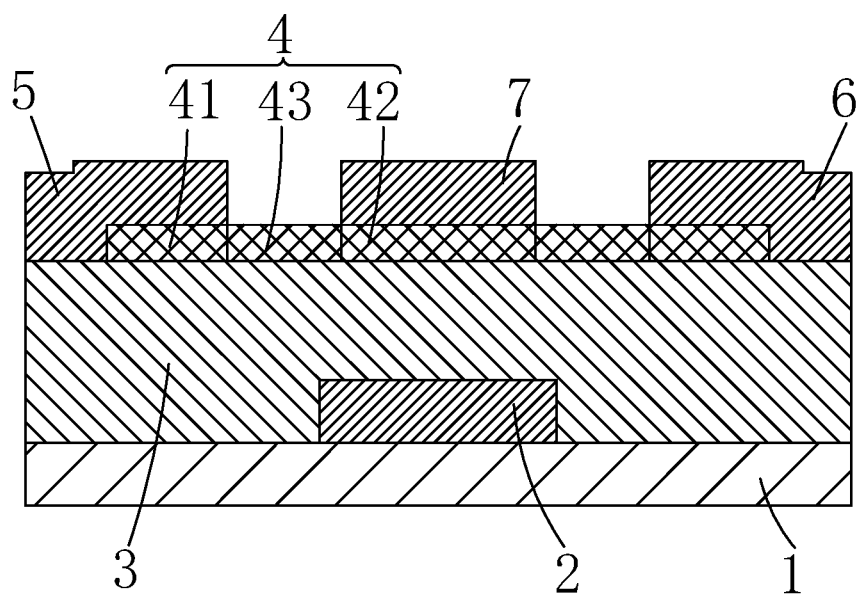
FIG. 2 is a cross-sectional view illustrating the structure of a LTPS TFT substrate according to the present invention.

Referring to FIG. 2, firstly, the present invention provides a low temperature poly-silicon (LTPS) thin-film transistor (TFT) substrate, which comprises a base plate 1, a gate electrode 2 formed on the base plate 1, a gate insulation layer 3 formed on the base plate 1 and the gate electrode 2, a poly-silicon layer 4 formed on the gate insulation layer 3, a source electrode 5 and a drain electrode 6 formed on the gate insulation layer 3 and the poly-silicon layer 4, and a metal layer 7 formed on the poly-silicon layer 4 and located between the source electrode 5 and the drain electrode 6.

The poly-silicon layer 4 comprises source/drain contact zones 41 located on two opposite sides thereof and respectively in engagement with the source electrode 5 and the drain electrode 6, a channel zone 42 located under the metal layer 7, and lightly-doped drain (LDD) zones 43 respectively located between the source/drain contact zones 41 and the channel zone 42.

Specifically, the base plate 1 comprises a glass plate.

Specifically, the gate insulation layer 3 is formed of a material comprising silicon nitride ($SiN_x$), silicon oxide ($SiO_x$), or a combination thereof.

Specifically, the gate electrode 2, the source electrode 5, the drain electrode 6, and the metal layer 7 are each formed of a material comprising one of molybdenum (Mo), aluminum (Al), and copper (Cu) or a stacked combination of multiple ones thereof.

Optionally, the source/drain contact zones 41 are N-type heavily-doped zones, the channel zone 42 is a P-type heavily-doped zone, and the LDD zones 43 are N-type lightly-doped zones; or alternatively, the source/drain contact zones 41 are P-type heavily-doped zones, the channel zone 42 is an N-type heavily-doped zone, and the LDD zones 43 are N-type lightly-doped zones.

Preferably, the N-type heavily-doped zones and the N-type lightly-doped zones are doped with ions that are phosphorous ions or arsenic ions; and the P-type heavily-doped zones are doped with ions that are boron ions or gallium ions.

Specifically, the N-type heavily-doped zones or the P-type heavily-doped zones are doped with ion concentrations with a range of $10^{19}$-$10^{21}$ ions/cm$^3$, and the N-type lightly-doped zones are doped with ion concentrations within a range of $10^{16}$-$10^{17}$ ions/cm$^3$.

In the above LTPS TFT substrate, the channel zone is provided, atop, with a metal layer, such that the metal layer and the source electrode and the drain electrode may serve as a mask to form the LDD zones in the poly-silicon layer in order to save the mask needed for separately forming the LDD zones. Further, due to the addition of the metal layer that is connected to the channel zone of the poly-silicon layer, the electrical resistance of the channel zone can be effectively reduced to increase a TFT on-state current.

Figure 3:
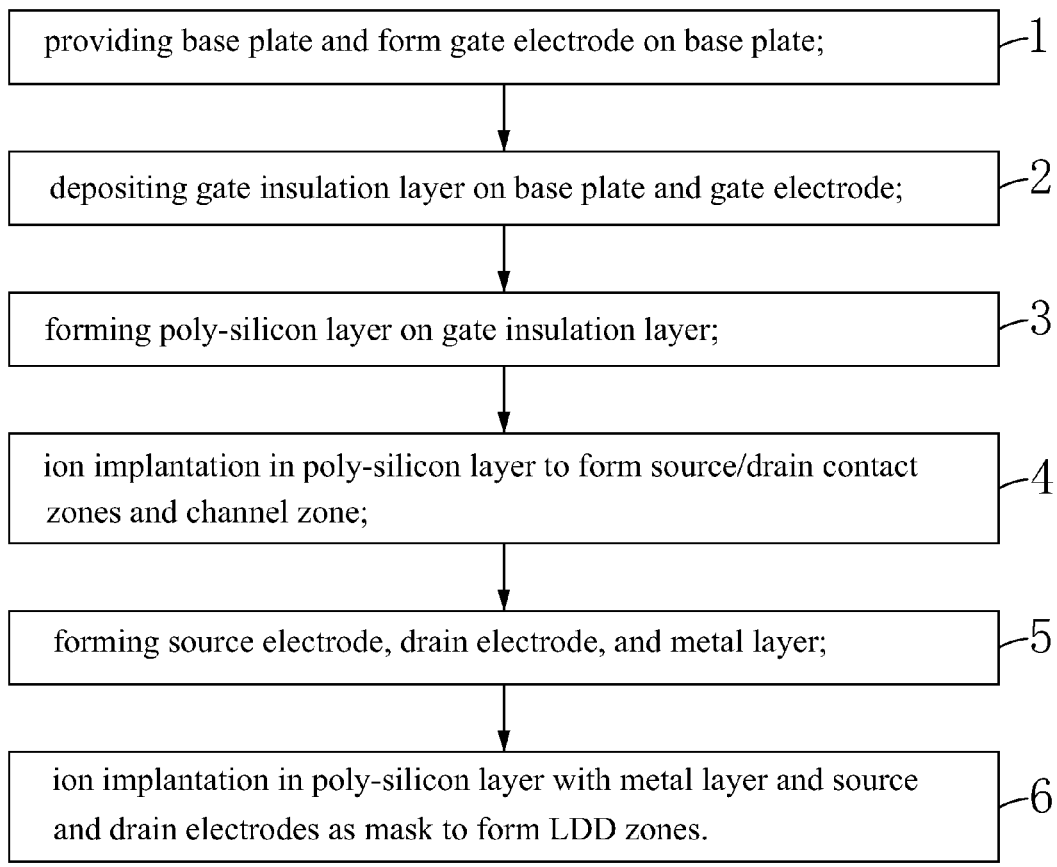
FIG. 3 is a flow chart illustrating a LTPS TFT substrate manufacturing method according to the present invention.

Referring to FIG. 3, in combination with FIG. 2, the present invention also provides a LTPS TFT substrate manufacturing method, which comprises the following steps:

Step 1: providing a base plate 1, depositing a first metal layer on the base plate 1, and subjecting the first metal layer to a patterning operation to form a gate electrode 2.

Specifically, in Step 1, the base plate 1 comprises a glass plate.

Step 2: depositing a gate insulation layer 3 on the base plate 1 and the gate electrode 2.

Specifically, in Step 2, the gate insulation layer 3 is formed of a material comprising silicon nitride, silicon oxide, or a combination thereof.

Step 3: forming a poly-silicon layer 4 on the gate insulation layer 3.

Step 4: subjecting two opposite sides of the poly-silicon layer 4 to ion implantation to form source/drain contact zones 41; and subjecting a central area of the poly-silicon layer 4 to ion implantation to form a channel zone 42.

Step 5: depositing a second metal layer on the gate insulation layer 3 and the poly-silicon layer 4 and subjecting the second metal layer to a patterning operation to form a source electrode 5, a drain electrode 6, and a metal layer 7 located between the source electrode 5 and the drain electrode 6.

Specifically, the gate electrode 2, the source electrode 5, the drain electrode 6, and the metal layer 7 are each formed of a material comprising one of molybdenum, aluminum, and copper or a stacked combination of multiple ones thereof.

Step 6: using the metal layer 7 and the source and drain electrodes 5, 6 as a mask to subject the poly-silicon layer 4 to ion implantation so as to form LDD zones 43 located respectively between the source/drain contact zones 41 and the channel zone 42.

Optionally, the source/drain contact zones 41 are N-type heavily-doped zones, the channel zone 42 is a P-type heavily-doped zone, and the LDD zones 43 are N-type lightly-doped zones; or alternatively, the source/drain contact zones 41 are P-type heavily-doped zones, the channel zone 42 is an N-type heavily-doped zone, and the LDD zones 43 are N-type lightly-doped zones.

Preferably, the N-type heavily-doped zones and the N-type lightly-doped zones are doped with ions that are phosphorous ions or arsenic ions; and the P-type heavily-doped zones are doped with ions that are boron ions or gallium ions.

Specifically, the N-type heavily-doped zones or the P-type heavily-doped zones are doped with ion concentrations with a range of $10^{19}$-$10^{21}$ ions/cm$^3$, and the N-type lightly-doped zones are doped with ion concentrations within a range of $10^{16}$-$10^{17}$ ions/cm$^3$.

In the above-described LTPS TFT substrate manufacturing method, at the same time of forming a source electrode and a drain electrode, a metal layer is formed on a channel zone and the metal layer, the source electrode, and the drain electrode are used as a mask to form LDD zones in the poly-silicon layer so as to save the mask needed for separately forming the LDD zones thereby reducing the manufacturing cost and increasing throughput.

In summary, the present invention provides a LTPS TFT substrate, which comprises a metal layer formed on a channel zone so that the metal layer, a source electrode, and a drain electrode can be used as a mask to form LDD zones in a poly-silicon layer in order to save the mask needed for separately forming the LDD zones; further, due to the addition of the metal layer that is connected to the channel zone of the poly-silicon layer, the electrical resistance of the channel zone can be effectively reduced to increase a TFT on-state current. The present invention also provides a LTPS TFT substrate manufacturing method, in which at the same time of forming a source electrode and a drain electrode, a metal layer is formed on a channel zone and the metal layer, the source electrode, and the drain electrode are used as a mask to form LDD zones in a poly-silicon layer so as to save the mask needed for separately forming the LDD zones thereby reducing the manufacturing cost and increasing throughput.

Based on the description given above, those having ordinary skills of the art may easily contemplate various changes and modifications of the technical solution and technical ideas of the present invention and all these changes and modifications are considered within the protection scope of right for the present invention.

What is claimed is:

1. A low temperature poly-silicon (LTPS) thin-film transistor (TFT) substrate manufacturing method, comprising the following steps:
   (1) providing a base plate, depositing a first metal layer on the base plate, and subjecting the first metal layer to a patterning operation to form a gate electrode;
   (2) depositing a gate insulation layer on the base plate and the gate electrode;
   (3) forming a poly-silicon layer on the gate insulation layer;
   (4) subjecting two opposite sides of the poly-silicon layer to ion implantation to form source/drain contact zones; and subjecting a central area of the poly-silicon layer to ion implantation to form a channel zone;
   (5) depositing a second metal layer on the gate insulation layer and the poly-silicon layer and subjecting the second metal layer to a patterning operation to form a source electrode, a drain electrode, and a metal layer located between the source electrode and the drain electrode; and
   (6) using the metal layer and the source and drain electrodes as a mask to subject the poly-silicon layer to ion implantation so as to form lightly-doped drain (LDD) zones located respectively between the source/drain contact zones and the channel zone.

2. The LTPS TFT substrate manufacturing method as claimed in claim 1, wherein in step (1), the base plate comprises a glass plate.

3. The LTPS TFT substrate manufacturing method as claimed in claim 1, wherein in step (2), the gate insulation layer is formed of a material comprising silicon nitride, silicon oxide, or a combination thereof.

4. The LTPS TFT substrate manufacturing method as claimed in claim 1, wherein the gate electrode, the source electrode, the drain electrode, and the metal layer are each formed of a material comprising one of molybdenum, aluminum, and copper or a stacked combination of multiple ones thereof.

5. The LTPS TFT substrate manufacturing method as claimed in claim 1, wherein the source/drain contact zones are N-type heavily-doped zones; the channel zone is a P-type heavily-doped zone; and the LDD zones are N-type lightly-doped zones; or alternatively the source/drain contact zones are P-type heavily-doped zones; the channel zone is an N-type heavily-doped zone; and the LDD zones are N-type lightly-doped zones.

* * * * *